(12) United States Patent
van den Berghe (10) Patent No.: US 6,374,387 B1
(45) Date of Patent: Apr. 16, 2002

(54) VITERBI DECODING OF PUNCTURED CONVOLUTIONAL CODES WITHOUT REAL-TIME BRANCH METRIC COMPUTATION

(75) Inventor: Larry van den Berghe, Burlington (CA)

(73) Assignee: Institute of Microelectronics, Singapore (SG)

(*) Notice: Subject to any disclaimer, the term of this patent is extended or adjusted under 35 U.S.C. 154(b) by 0 days.

(21) Appl. No.: 09/377,564

(22) Filed: Aug. 19, 1999

(30) Foreign Application Priority Data

May 27, 1999 (SG) .............................. 9902595

(51) Int. Cl.$^7$ ........................ H03M 13/41; H03M 13/23
(52) U.S. Cl. ...................... 714/790; 714/795; 714/796
(58) Field of Search ................................ 714/795, 796, 714/790

(56) References Cited

U.S. PATENT DOCUMENTS

| | | | |
|---|---|---|---|
| 4,414,667 A | 11/1983 | Bennett | 371/37 |
| 4,489,418 A | 12/1984 | Mazo | 375/27 |
| 4,583,078 A * | 4/1986 | Shenoy et al. | 340/347 DD |
| 4,623,999 A | 11/1986 | Patterson | 371/37 |
| 4,897,814 A | 1/1990 | Clark | 365/49 |
| 5,151,904 A * | 9/1992 | Reiner et al. | 371/43 |
| 5,162,797 A * | 11/1992 | Murata et al. | 341/107 |
| 5,220,570 A * | 6/1993 | Lou et al. | 371/43 |
| 5,331,665 A * | 7/1994 | Busschaert et al. | 375/94 |
| 5,392,429 A | 2/1995 | Agrawal et al. | 395/650 |
| 5,587,710 A | 12/1996 | Choo et al. | 341/107 |
| 5,596,589 A | 1/1997 | Thomsen et al. | 371/37.8 |
| 5,651,032 A | 7/1997 | Okita | 375/341 |
| 5,710,784 A * | 1/1998 | Kindred | 371/43 |
| 5,880,959 A | 3/1999 | Shah et al. | 364/468.03 |
| 5,970,104 A * | 10/1999 | Zhong et al. | 375/341 |
| 5,996,104 A | 11/1999 | Herzberg | 714/755 |
| 6,205,187 B1 * | 3/2001 | Westfall | 375/341 |
| 6,272,661 B1 * | 8/2001 | Yamaguchi | 714/795 |
| 6,289,487 B1 * | 9/2001 | Hessel et al. | 714/795 |

OTHER PUBLICATIONS

Chishtie, Mansoor A., "A TMS320C53–Based Enhanced Forward Error–Correction Scheme for U.S. Digital Cellular Radio."

Chishtie, Mansoor A., "U.S. Digital Cellular Error–Correcting Coding Algorithm Implementation on the TMS320C5x."

* cited by examiner

Primary Examiner—Stephen M. Baker
(74) Attorney, Agent, or Firm—Proskauer Rose, LLP (57) ABSTRACT

An apparatus is provided in a digital communications device for efficiently determining the Hamming distance for trellis based decoders, such as decoders for punctured convolutional codes. The Hamming distance is pre-determined for all codes and stored in program memory. In one version, the device comprises five components including a state sequencing circuit, a Hamming distance table generator, a Hamming distance table, a Hamming distance retrieval circuit, and an ACS circuit. The state sequencer groups all of the possible $2^m$ possible states into groups of similar branch metrics. The Hamming distance table generator is responsive to the state sequencer and determines the Hamming distance for all combinations of puncture code, received symbol, and transition paths. This may be performed once and stored in permanent memory or performed each time the digital communications device is initialized and stored in a random access memory. The Hamming distance table is a memory arranged as a three dimensional table which stores the results of the Hamming distance table generator. The Hamming distance table receives addresses and data from the Hamming distance table generator. The table may be a permanent memory or a random access memory. The Hamming distance retrieval circuit receives the puncture code and the received symbol and, based on these inputs, retrieves the appropriate information from the Hamming distance table. The ACS circuit is responsive to an output of the Hamming distance table and the state sequencer to output the surviving path metrics for all trellis states corresponding to the received symbol.

29 Claims, 10 Drawing Sheets

| TRANSITION SYMBOL | EVEN STATE TRANSITION | | ODD STATE TRANSITION | |
|---|---|---|---|---|
| | PREVIOUS STATE | CURRENT STATE | PREVIOUS STATE | CURRENT STATE |
| 000 | 0 → | 0 | 8 → | 1 |
| 111 | 8 → | 0 | 0 → | 1 |
| 000 | 13 → | 10 | 5 → | 11 |
| 111 | 5 → | 10 | 13 → | 11 |
| 101 | 1 → | 2 | 9 → | 3 |
| 010 | 9 → | 2 | 1 → | 3 |
| 101 | 12 → | 8 | 4 → | 9 |
| 010 | 4 → | 8 | 12 → | 9 |
| 011 | 2 → | 4 | 10 → | 5 |
| 100 | 10 → | 4 | 2 → | 5 |
| 011 | 15 → | 4 | 7 → | 15 |
| 100 | 7 → | 4 | 15 → | 15 |
| 110 | 3 → | 6 | 11 → | 7 |
| 001 | 11 → | 6 | 3 → | 7 |
| 110 | 14 → | 12 | 6 → | 13 |
| 001 | 6 → | 12 | 14 → | 13 |

VITERBI DECODING OF PUNCTURED CONVOLUTIONAL CODES WITHOUT REAL-TIME BRANCH METRIC COMPUTATION

BACKGROUND OF THE INVENTION

1. Field of the Invention

The present invention relates to channel decoders for digital wireless communications devices. More particularly, the present invention provides a method and apparatus for a digital wireless communications device to decode in real-time a received signal which was encoded using a punctured convolutional code. In a preferred embodiment, a channel decoder is provided which permits Viterbi decoding of signals which have been encoded with a convolutional code, including a punctured convolutional code, without determining the branching metric in real-time.

2. Discussion of Related Art

Figure 1:
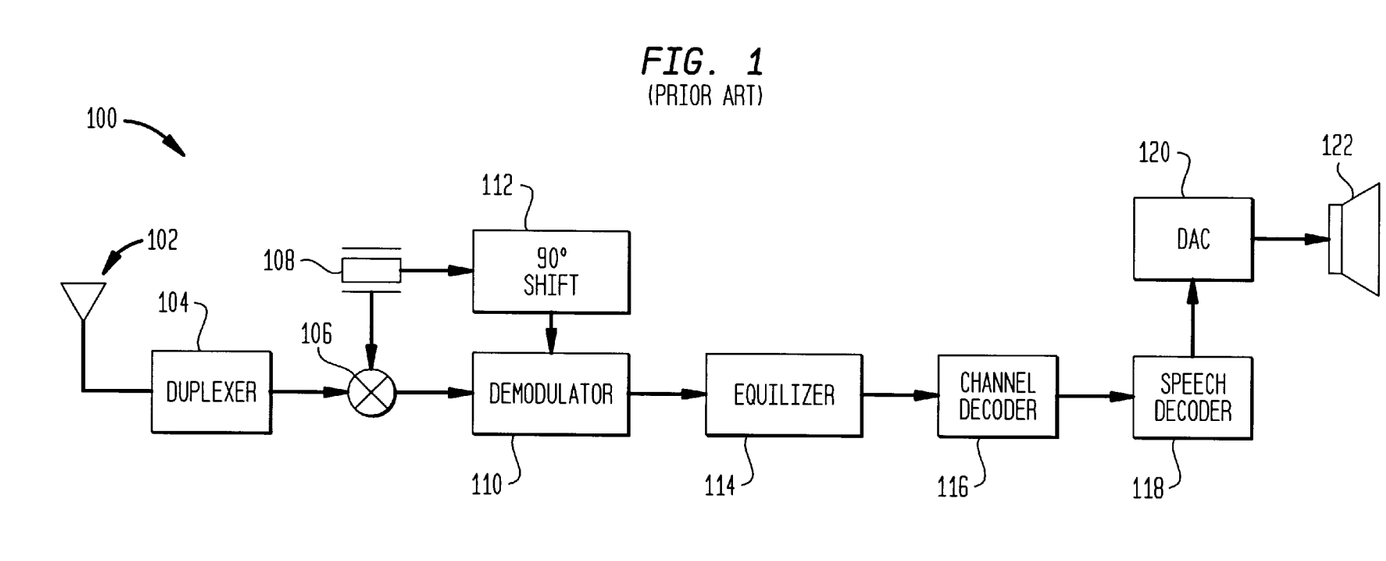
FIG. 1 is a simplified block diagram of a conventional digital telephone reception portion.

FIG. 1 is a simplified block diagram of a reception portion of a digital wireless communications device 100, such as a digital cellular phone which may be used with a TMS320C5x digital signal processor made by Texas Instruments, Dallas Tex. or other suitable processor. A preferred digital cellular phone may include an antenna 102, a duplexer 104, a mixer 106, an oscillator 108, a demodulator 110, a 90°-phase shifter 112, an equalizer 114, a channel decoder 116, a speech decoder 118, a digital-to-analog converter (DAC) 120, and a speaker 122.

The reception portion of the digital cellular telephone of FIG. 1 may operate in the following manner. A digital communications signal may be received by the antenna 102 and passed through the duplexer 104 to the reception portion of the digital communications device 100. The mixer 106 steps the received signal to a lower workable frequency (called an intermediate frequency) by mixing the received signal with a frequency provided by an oscillator 108. The signal, now at an intermediate frequency, is demodulated by the demodulator 110. The demodulator 110 extracts information from the intermediate frequency. The demodulator may receive a signal from the oscillator 108 which has been shifted 90° by the 90°-phase shifter 112. A preferred modulation (and thus demodulation) technique is differential quaternary phase-shift keying (DQPSK), but other modulation techniques may also be used.

The demodulated signal is then sent to the equalizer 114 to be equalized to account for channel distortion such as Rayleigh fading (caused by multi-path effects) and Doppler effects (caused by the movement of the transmitter with respect to the received signal). The equalizer 114 is essentially an inverse filter of channel distortion. The channel decoder 116 detects and corrects errors in the bit stream, demultiplexes control data, and feeds the data to the speech decoder 118. As discussed below, if a convolutional encoding scheme, such as a punctured convolutional encoding scheme, was used to encode the received signal, a Viterbi decoding scheme may be used to detect and correct errors in the bit stream. The channel decoded signal is then sent to the speech decoder 118, which decodes any speech encoding which may have been performed on the received signal. A preferred speech coding method is vector sum excited linear prediction (VSELP), but other speech coding methods may also be used. The DAC 120 converts the digital signal into an analog signal suitable to drive the speaker 122.

One method to improve the reliability of a telecommunications network is to add error control processing at the transmitting and receiving ends of the network. One method of doing this is to add redundancy to the transmitted signal so that the receiving channel decoder 116 may make a decoding decision based on more than a single bit.

One common type of error control technique used in digital telecommunications networks is a convolutional code. A convolutional code is a code which provides n output symbols for each group of k input symbols. The code rate is defined as R=k/n. For example, if two symbols are output for every one input symbol, the code rate is 1/2. While convolutional encoding provides adequate redundancy for effective error control, it also increases the bandwidth of the signal because it adds a number of symbols to the transmitted signal. The inverse of the code rate is known as the bandwidth expansion of the unpunctured convolutional encoder. Thus, for a 1/2 code rate, the bandwidth expansion is 2, i.e., the bandwidth used by signal is doubled.

One way to improve the bandwidth expansion of convolutional codes is to "puncture" the code. Puncturing a convolutional code means that periodically a certain number of bits in the convolutional encoder output are deleted at a fixed rate. This rate is called the puncture rate.

Figure 2:
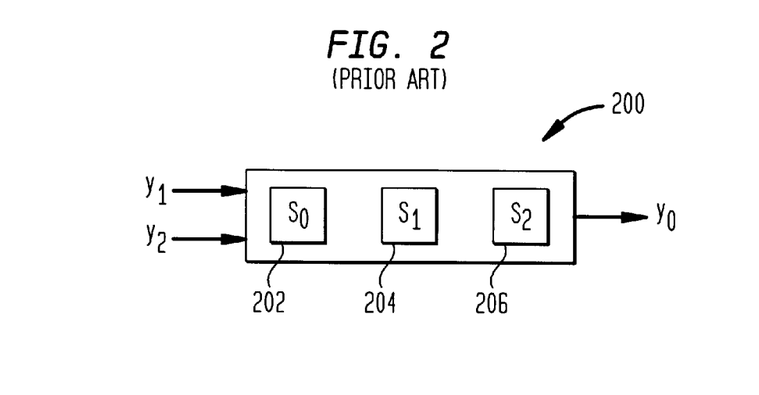
FIG. 2 is a simplified block diagram of a convolutional channel encoder.

FIG. 2 illustrates an example of a convolutional encoder 200. In this exemplary encoder 200, two bits $Y_1$ and $Y_2$ are provided to the convolutional encoder and the encoder outputs a bit $Y_0$. The $Y_0$ bit carries only forward error correction information and thus is referred to as a redundant bit. As seen in FIG. 2, a typical convolutional encoder is a 3-bit shift register having three states 202, 204, 206 interconnected by AND and XOR logic (not shown). The combined set of three bits 202, 204, 206 of encoder memory ($S_0$, $S_1$, $S_2$) is typically referred to as the delay state. The output bits ($Y_0$, $Y_1$, $Y_2$) are grouped into an output symbol typically referred to as the path state. Note that given a particular delay state ($S_0$, $S_1$, $S_2$) not all path states may be possible in that time interval.

Figure 3:
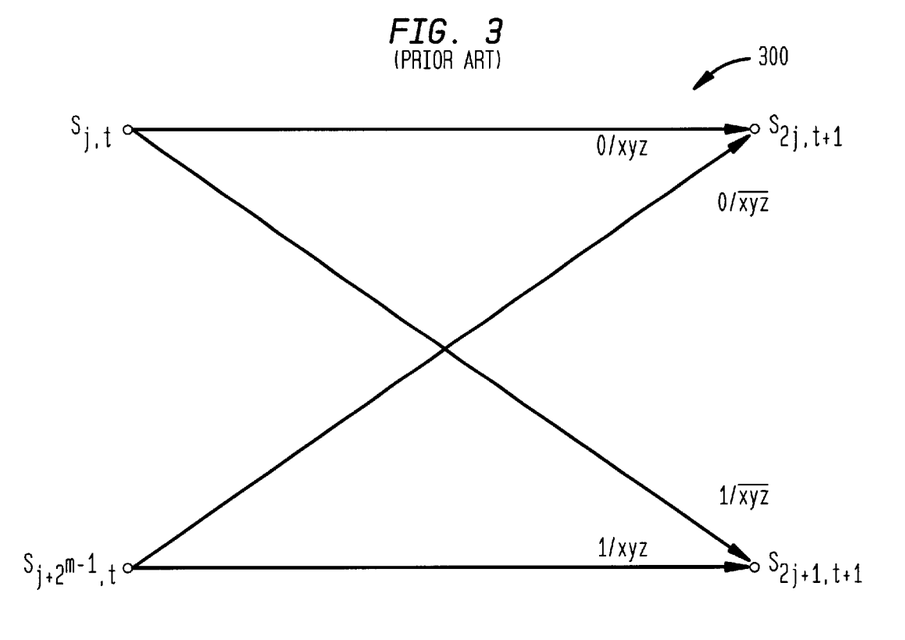
FIG. 3 is a Viterbi butterfly diagram illustrating possible state changes in the channel encoder of FIG. 2.

Because the encoder 200 may be considered to be a finite state machine, a finite state diagram may be used to represent the possible states the machine may be in at a particular time. FIG. 3 is a trellis diagram 300 of an encoder which may be in one of either of two states: 0 or 1. This trellis diagram 300 is often referred to as a Viterbi butterfly. As seen in FIG. 2, the encoder 200 has m delay elements (in this example, m=3) and may be described as having $2^m$ (in this example, 8) states, a.k.a. trellis states. For each new information bit shifted into the register, r output bits (in this example, 3) are generated by the multiplexing of r different generator polynomials g, where g is a generator polynomial described by a set of XOR operations on selected delay elements of the encoder 200. For each steady state of the register, these output bits (or one output symbol) are used to describe the state transition from the previous steady state of the register to the current steady state of the register. This output symbol shall hereinafter be referred to as a "transition symbol". There are $2^r$ (in this example, 8) possible different transition symbols.

For each current state, there are two possible new states. These states are determined by whether the new information bit is a 0 or 1. Likewise, for each current state there are two possible previous states (0 or 1). This is illustrated in FIG. 3, which is a trellis structure 300 illustrating the possible states of the convolutional encoder 200 of FIG. 2. In FIG. 3, the designation 0/xyz indicates a 0 input bit and a transition symbol of xyz; the designation 0/*xyz* indicates a 0 input bit and that the transition symbol is the complement of xzy (in the text, italicized type indicates "complement".) The function of a decoder is to determine the most likely output. One way to do this is to use a sequence of states to determine the path having the lowest "cost", i.e., the path which deviates the least from the received signal. Cost functions may be unique to each modulation technique. One commonly used cost function is a Hamming distance, which is often used for binary signals. (Although Hamming distances are described and claimed herein, a person skilled in the art readily recognizes that other suitable cost functions may be used.) A Viterbi decoder, for example, determines the most likely sequence of states experienced by the convolutional encoder 200 when it encodes the received signal.

A Hamming distance $d_h$ may be determined by accumulating the result of an exclusive-or (XOR) operation between each bit of the received code and the respective bits of the trellis branch. Given sufficient precision in the processor, a single XOR operation at symbol level may be used to determine the error symbol. This is followed by the accumulation of error bits, which requires additional operations. For example, if the result of the XOR on the three bit symbol is 110, it indicates that the first two bits of the received symbol are different from the reference transition symbol. Thus, the Hamming distance is the algebraic sum of the number of bits in error, in this case being two.

For each received symbol, the branch metrics for each of the possible states are calculated by comparing the received symbol with the two path metrics for each state. This is called the branch metric step. Then the path metrics are calculated by adding each branch metric with the surviving path metric from the state from which the branch originates. The two path metrics entering each state are then compared and the one having the lowest cost metric is chosen as the surviving path for that state. This is called the add/compare/select (ACS) step. This step is complicated when decoding a punctured convolutional code. The decoder decides which bits from the received symbols have been punctured (deleted) and to include in the $d_h$ accumulation only the result of the XOR operation for bits which have not been punctured. This results in additional computational complexity in the branch metric calculation stage.

After the surviving paths for all states and all received symbols are calculated, the received bitstream is determined by tracing back from the current state through each previous state to the first state. The state change for each transition is determined and consequently the input data to the convolutional codes causing that state change is also determined. This is called the trace back step.

The branch metric step is computationally intensive and is performed frequently even during a single transmission.

Therefore, it is an object of the present invention to provide an improved method and apparatus for performing the branch metric step without real-time computation.

SUMMARY OF THE INVENTION

This and other objects of the present invention are provided by an apparatus in a digital wireless communications device for efficiently determining the $d_h$ for trellis based decoders, such as decoders for punctured convolutional codes. In a preferred embodiment, $d_h$ is pre-determined for all codes and stored in program memory, thereby avoiding real-time computation of the metric.

Preferably, the inventive device comprises five components. These components include a state sequencing circuit, a Hamming distance table generator, a Hamming distance table, a Hamming distance retrieval circuit, and an ACS circuit.

The state sequencer groups all of the $2^m$ possible states into groups of similar branch metrics. The Hamming distance table generator is responsive to the state sequencer and determines the Hamming distance for all combinations of puncture codes, received symbols, and transition symbols. This may be performed once and stored in permanent memory or may be performed each time the digital communications device is initialized and stored in a random access memory. The Hamming distance table is a memory arranged as a three dimensional table which stores the results of the Hamming distance table generator. The Hamming distance table receives addresses and data from the Hamming distance table generator. The table may be stored in a permanent memory or a volatile or random access memory. The Hamming distance retrieval circuit receives the puncture code and the received symbols and, based on these inputs, retrieves the appropriate information from the Hamming distance table. The ACS circuit is responsive to an output of the Hamming distance table and the state sequencer and calculates the surviving paths for the states in the order determined by the state sequencer.

As a result of the inventive device, the branch metric may be obtained without determining the branch metric in real-time. Rather, the branch metrics for all possible states and puncture codes are predetermined, stored in memory, and retrieved. This greatly reduces the computational needs of a trellis decoder, particularly for decoding a signal using a punctured convolutional code. As a result, the Viterbi decoding process may be performed more efficiently and with fewer computations.

BRIEF DESCRIPTION OF THE DRAWINGS

The present invention is described with reference to the following figures.

DETAILED DESCRIPTION OF PREFERRED EMBODIMENTS

Overview of the Invention

Figure 4:
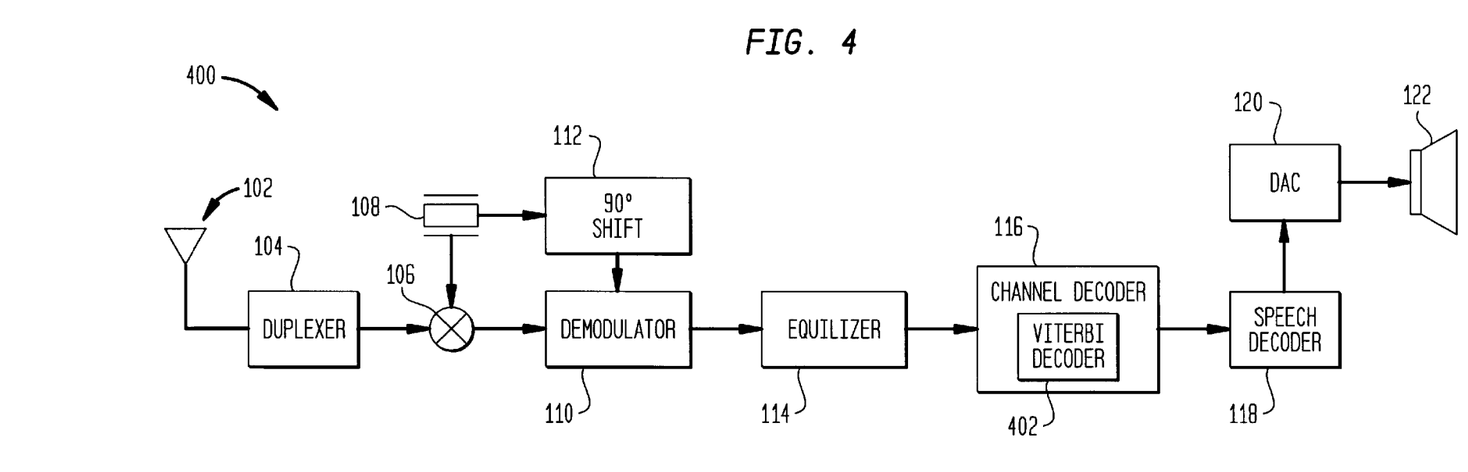
FIG. 4 is a simplified block diagram of a digital telephone reception portion having a Viterbi decoding device according to a preferred embodiment of the present invention.

FIG. 4 is a simplified block diagram of a reception portion of a digital wireless communications device 400 according to a preferred embodiment of the present invention. The device 400 may be a digital cellular phone which may be used with a TMS320C5x digital signal processor made by Texas Instruments or other suitable processor. The device 400 may be similar to the device 100 of FIG. 1. The device 400 according to the present invention, however, includes in the channel decoder 116 a Viterbi decoder 402 according to the present invention.

Figure 5:
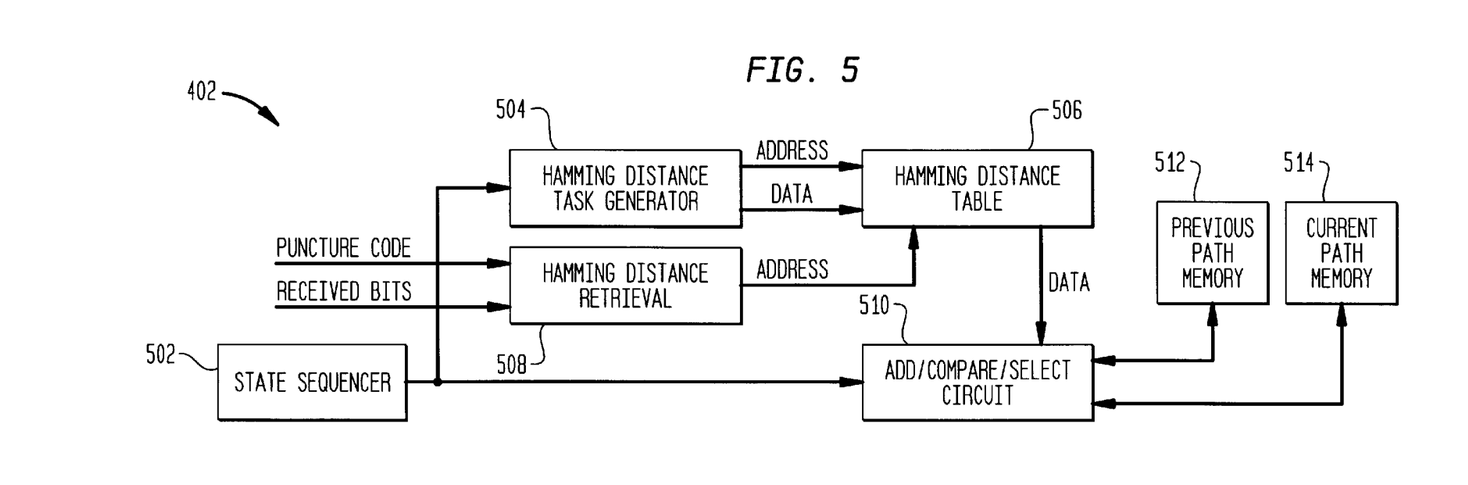
FIG. 5 is a block diagram of a Viterbi decoder according to a preferred embodiment of the present invention.

FIG. 5 is a block diagram of a Viterbi decoder 402 according to a preferred embodiment of the present invention As seen in FIG. 5, the Viterbi decoder includes a state sequencer 502, a Hamming distance table generator 504, a Hamming distance table 506, a Hamming distance retrieval circuit 508, and an ACS circuit 510.

The state sequencer 502 groups all of the $2^m$ possible states into groups of similar branch metrics. The Hamming distance table generator 504 is responsive to the state sequencer 502 and determines the Hamming distance for all combinations of puncture codes, received symbols, and transition symbols according to a preferred embodiment of the present invention. This may be performed once and stored in permanent memory or be performed each time the digital communications device 400 is initialized and stored in a volatile or random access memory.

The Hamming distance table 506 is a memory arranged as a three dimensional table which stores the results of the Hamming distance table generator 504. The Hamming distance table 506 receives addresses and data from the Hamming distance table generator. The table may be stored in a permanent memory or a volatile or random access memory. The Hamming distance retrieval circuit 508 receives the puncture code and the received symbol and, based on these inputs, calculates the correct address location and retrieves the appropriate information from the Hamming distance table 506.

The ACS circuit 510 is responsive to an output of the Hamming distance table 506 and the state sequencer 502 and calculates the surviving paths for the states in the order determined by the state sequencer. Preferably, the ACS circuit 510 is in communication with a previous path memory 512 and a current path memory 514. The previous path memory 512 preferably comprises $2^m$ states notational, which are identified as states on the left side of the Viterbi butterfly cell 300. The previous path memory 512 may also have an address counter or pointer having values ranging from 0 to $2^m-1$ which may point to any of the $2^m$ locations. The current path memory 514 preferably comprises $2^m$ elements which store the surviving minimum path metrics for $2^m$ states notational identified as the states on the right hand side of the Viterbi butterfly cell 300. The current path memory 514 may also have an address counter or pointer having values ranging from 0 to $2^m-1$ which may point to any of the $2^m$ locations.

As a result of the inventive device, the branch metric may be performed without determining the branch metric in real-time. Rather, the branch metric for all possible states and puncture codes is predetermined, stored in memory, and retrieved. This greatly reduces the computational needs for Viterbi decoding, particularly for decoding a signal using a punctured convolutional code.

Structure and Operation of a Preferred Embodiment

State Sequencer

For a rate R=k/n coder, there are $2^r$ possible transition symbols that can be transmitted (where r is the bandwidth expansion of the unpunctured convolutional encoder defined as 1/R or n/k). Hence, there are also $2^r$ possible unpunctured received symbols. For a coder having m delay elements, there are $2^m$ possible states, and thus there are $(2 \times 2^m)$ different branch metrics to be determined in the decoder for each received symbol. Therefore each transition symbol is repeated $(2 \times 2^m)/2^r$ times. For example, in a 1/3 coder there are $2^3$ (i.e., 8) possible transition symbols, and a coder with m=4 will require $2 \times 2^4 = 32$ branch metrics to be calculated in the decoder with each transition symbol occurring four times. The embodiment where m=4 is used in ITU recommendation "Annex C to G.7231—Scalable channel coding scheme for wireless applications to be used with dual-rate speech coder for multimedia communications transmitting at 5.3 & 6.3 kbits/sec," November 1996. The contents of this document are incorporated herein by reference. For codes with larger m values, the transition symbol may be repeated for more states. That is, there are more states in the same group.

In a preferred embodiment, the state sequencer 502 groups all $2^m$ states into groups of $(2 \times 2^m)/2^r$ states of similar branch metrics. The output of the state sequencer 502 is applied to the Hamming distance table generator 504 and the ACS circuit 510.

Hamming Distance Table Generator

Figure 6:
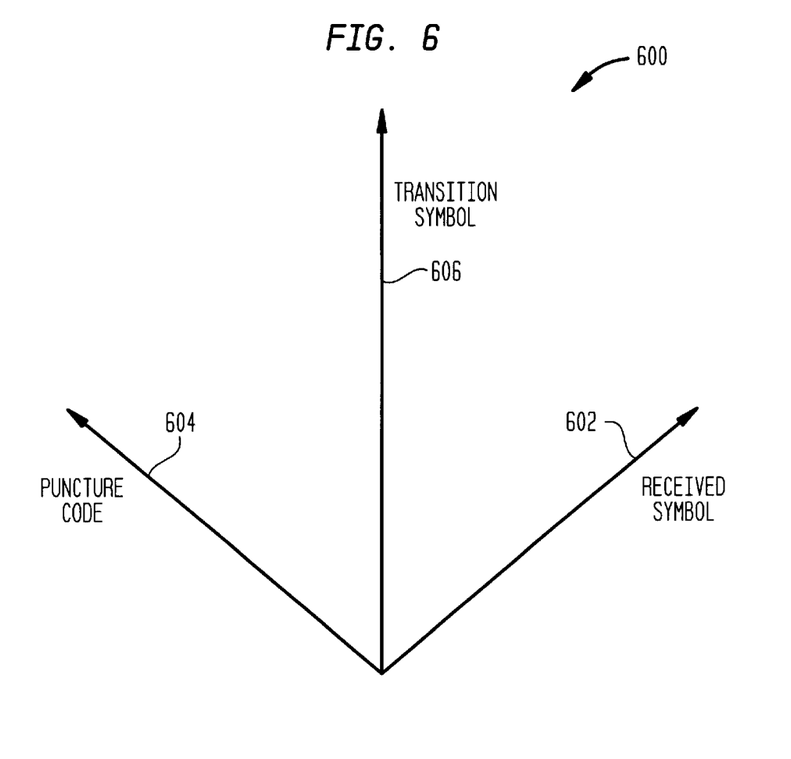
FIG. 6 is a graph illustrating the three dimensions of determining Hamming distances for a punctured convolutional code.

The Hamming distance table generator determines the Hamming distance for all combinations of puncture codes, received symbols, and transition symbols, the order of which is determined by the state sequencer 502 described above. The Hamming distance table generator 504 determines the Hamming distance for the three dimensional (3-D) relationship as shown in FIG. 6 and according to a sequence defined by the state sequencer 502. FIG. 6 is a graph 600 illustrating the three dimensional relationship for solving the Hamming distances for a punctured convolutional code. As seen in FIG. 6, a first axis 602 represents the received symbol. As indicated above, there are $2^r$ possible received symbols. A second axis 604 represents the puncture code (for the received symbol) which may vary during a transmission. The values of either or both of these two axes may vary with time, even during a single transmission. Associated with these varying values is a number of transition symbols, seen on a third axis 606. At any point in the three dimensional space lies a unique Hamming distance value. The Hamming distance table generator 504 solves these relationships and stores the results, herein known as distance metrics, in the Hamming distance table 506 which, as described below, is arranged as a three dimensional look-up table.

Figure 7:
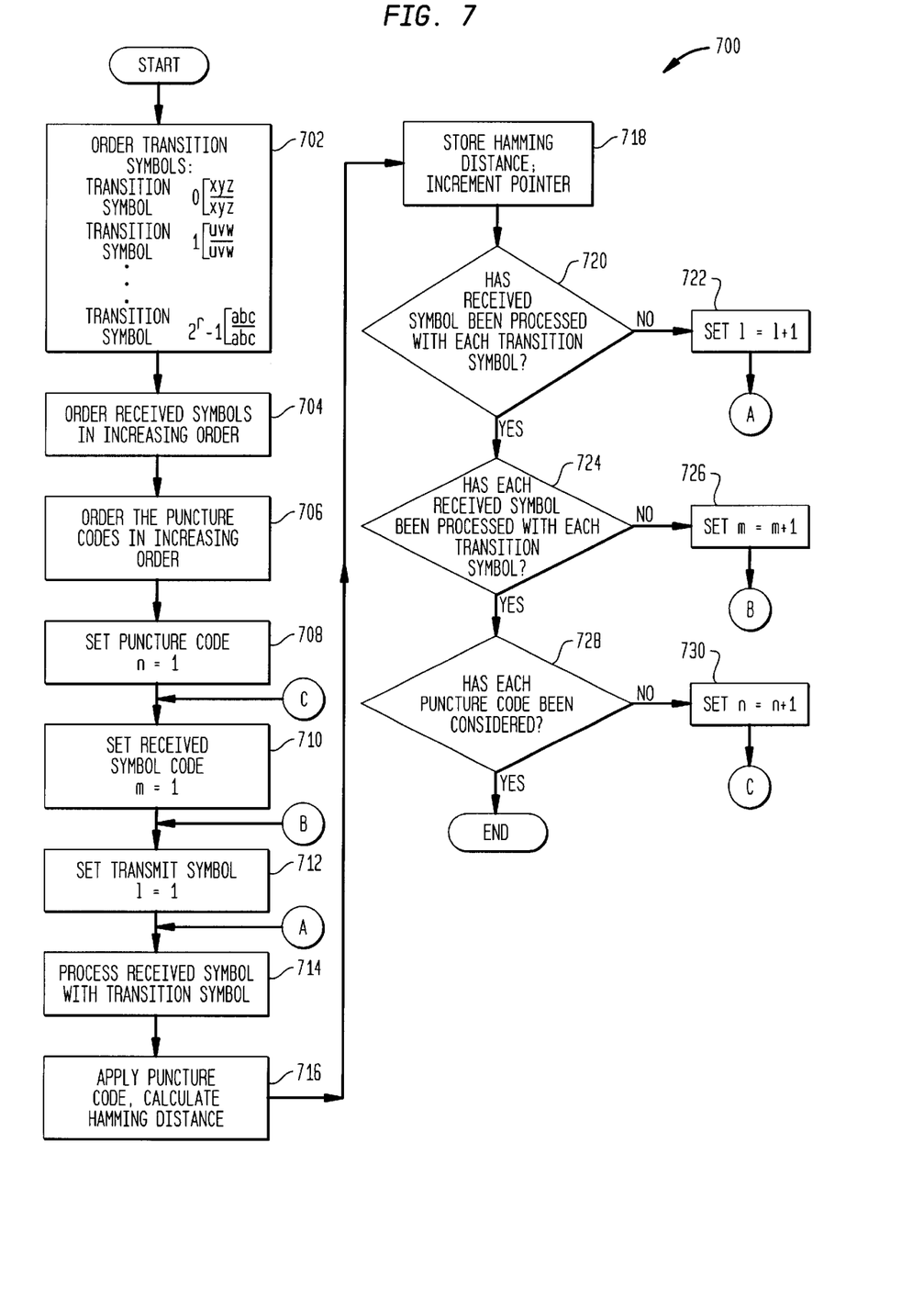
FIG. 7 is a flowchart illustrating a preferred method performed by the Hamming distance table generator according to the present invention.

FIG. 7 is a flowchart 700 illustrating a preferred method performed by the Hamming distance table generator 504. The Hamming distance table generator 504 preferably performs the following steps:

First, the $2^r$ transition symbols received from the state sequencer 502 are ordered according to the determined state sequencing as follows (step 702):

TRANSITION SYMBOL 0:

xyz xyz (where italics represent the complement)

TRANSITION SYMBOL 1:

uvw uvw

TRANSITION SYMBOL $2^r-1$:

abc abc

Figure 8A:
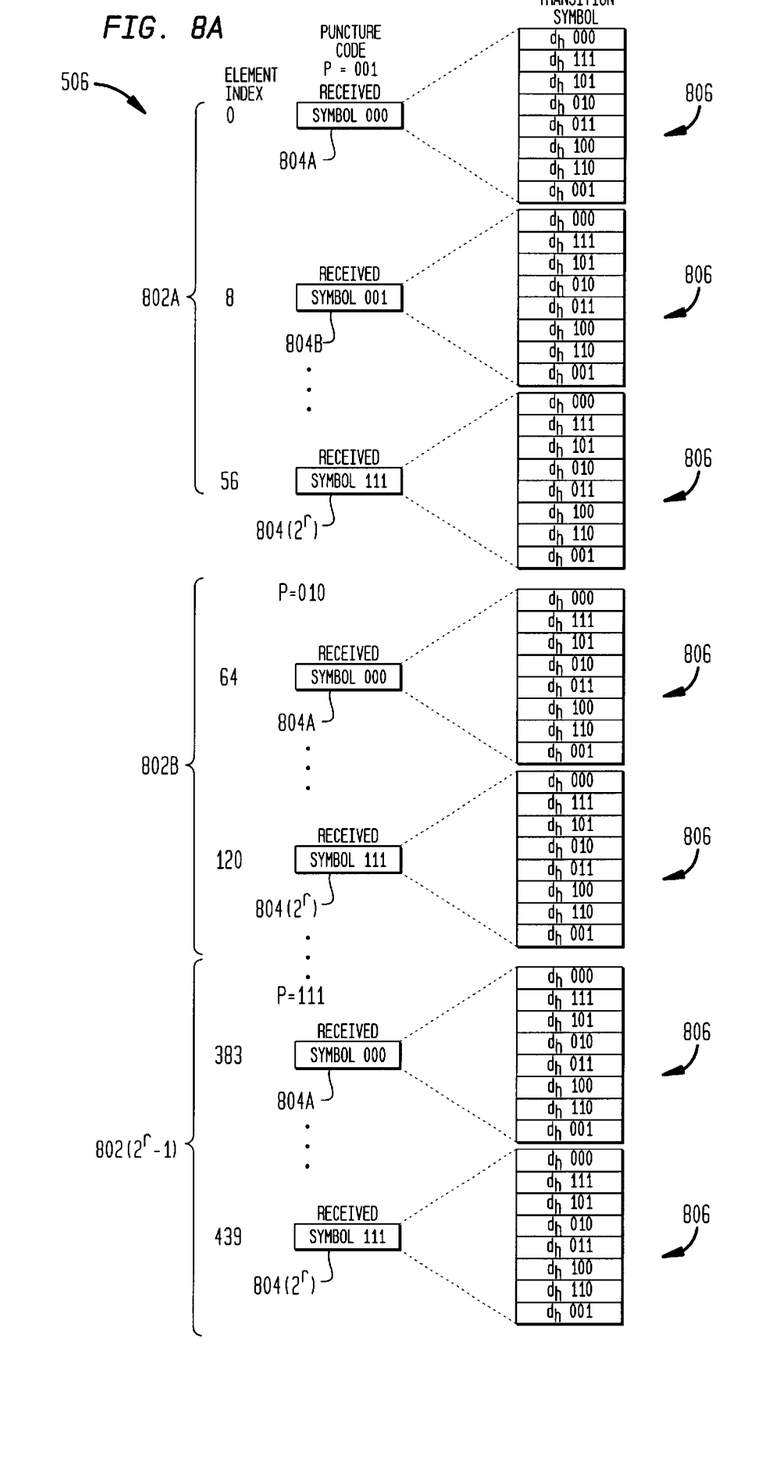
FIG. 8A is a block diagram illustrating a preferred layout of a Hamming distance table according to a preferred embodiment of the present invention.
Figure 8B:
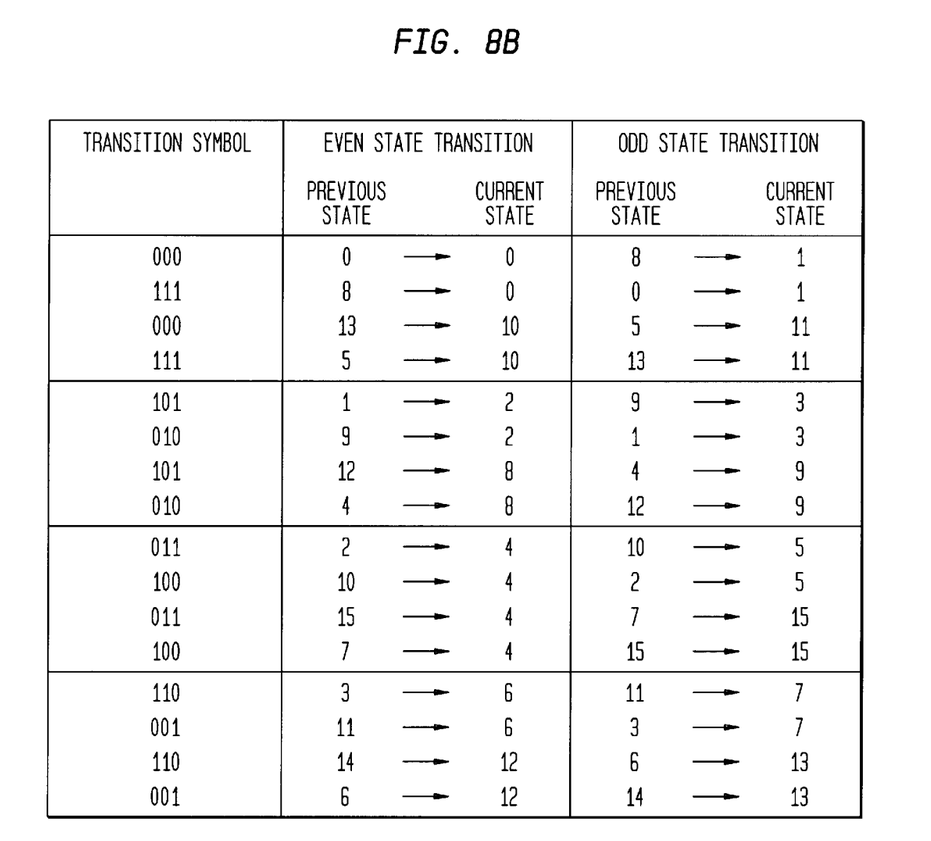
FIG. 8B illustrates the entries in a portion of the Hamming distance table.

This determined state sequence is applied by the ACS 510 as follows:
   (1) group states with the same transition symbols together in the order of the Hamming distance table 506, for example, as shown in FIG. 8B (described below);
   (2) retrieve the Hamming distance for one group of states;
   (3) determine the surviving path; and
   (4) repeat steps 1–3 for all transition symbols from 0 to $2^r-1$.

Second, the $2^r$ received symbols are ordered in increasing order (step 704). For example, where r=3, the received symbols may be ordered as follows: 000, 001, 010, 011, 100, 101, 110, 111. Third, the $2^r-1$ puncture codes are ordered in increasing order (step 706). For example, where r=3, the codes may be ordered as follows: 001, 010, 011, 100, 101, 110, 111. Fourth, the puncture code, received symbol, and transition symbol are each set to initial values (steps 708, 710, 712).

Next, the received symbol is processed with respect to the transition symbol (step 714). Preferably, the received symbol and transition symbol values are exclusive-ored (XORed) together. The puncture code is then applied to the processed received symbol and the cost, for example, the Hamming distance is determined (step 716). This may be performed as follows. Assume the received symbol is 01 and the puncture code is known to be 110. The 0 indicates a bit to be punctured (deleted). The puncture code indicates that the third bit was punctured. Thus, the received symbol has a 0 stuffed in the punctured position to become 010. Assume the path to which the received symbol to be compared with is 111. These two values are XORed together to yield 101 . This value is logic ANDed with the puncture code (110) to provide the Hamming distance. In this example, the results of the AND is 100 and the Hamming distance is the sum of these digits: 1+0+0=1. The determined Hamming distance is stored in the Hamming distance table 506 and the table address is increased by one to point to the next table memory location (step 718).

If the received symbol has not been processed with each transition symbol (step 720), the transition symbol memory location is incremented to the next transition symbol (step 722) and the process repeated. If every received symbol has not been processed with all of the transition paths (step 724) for the first puncture code, the received symbol memory location is incremented to the next received symbol (step 726) and the processed is repeated. If each received symbol has not been processed with each puncture code (step 728), the puncture code memory location is incremented to the next puncture code (step 730) and the process is repeated.

Attached as Appendix A is assembly code of a preferred method of determining the Hamming distance for a full range of puncture codes, received symbols and transition symbols.

Hamming Distance Table

The Hamming distance table 506 is a memory circuit arranged as a three dimensional look-up table. The Hamming distance table stores the results of the Hamming distance table generator 504 as distance metrics described above. This three dimensional look-up table has as a first dimension a range of puncture codes, as a second dimension a range of received symbols, and as a third dimension a range of transition symbols for a particular puncture code and received symbol. The Hamming distance table 506 contains a total of $(2^r-1) \times 2^r \times 2^r$ elements. An example of a preferred layout of a Hamming distance table 506 according to a preferred embodiment of the present invention is illustrated in FIG. 8A. As seen in FIG. 8A, the Hamming distance table is arranged by puncture codes, received symbols, and transition symbols. For each puncture code, a memory block 802A, 802B, . . . , $802(2^r-1)$ is arranged. Each memory block 802n is divided into sub-blocks 804A, 804B, $804(2^r$ for each of the possible $2^r$ received symbols. Each received symbol sub-block 804n includes a table 806 containing each possible cost, for example, Hamming distance, for the sequence of transition symbols for the appropriate puncture code and received symbol. The values stored in these tables were predetermined by the Hamming distance table generator.

FIG. 8B illustrates the entries in a portion of the Hamming distance table 506 which maps the states and path sequence for transition symbols of a certain puncture code. In this figure, "transition symbol" refers to the transmitted, unpunctured code symbol for a state transition; "even" refers to a current state which is an even state: 0, 2, 4, 6, . . . ; "odd" refers to a current state which is an odd state: 1, 3, 5, 7 . . . ; and 8→0 (or other transition) refers to a transition from state 8 to state 0. In the first row, 000 is the transition symbol for even state transitions 0→0 and 13→10 and odd state transitions 8→1 and 5→11; while 111, which is the complement of 000, is the transition symbol for even state transitions 8→0 and 5→10 and odd state transitions 0→1 and 13→11. The rows are grouped into states having the same branch path metric and complement.

As described above, the Hamming distance table 506 may be a permanent memory. If so, values may be determined once and stored. Alternatively, the Hamming distance table 506 may be a random access or volatile memory and the values are determined and stored periodically, such as each time the digital cellular communications device 400 is initialized.

Hamming Distance Retrieval Circuit

The Hamming distance retrieval circuit 508 receives the received puncture code and received bits. This circuit 508 packs the received bits into the respective received symbols. An erasure bit of 0 is stuffed into the punctured bit location for that received symbol.

The Hamming distance retrieval circuit 508 then determines an address from which to retrieve a Hamming distance metric from the Hamming distance table 506. Preferably, the Hamming distance retrieval circuit is configured to combine the received puncture code and received symbol to obtain an address in the Hamming distance table containing desired information. In a preferred embodiment, the address is generated in the following manner.

Figure 9:
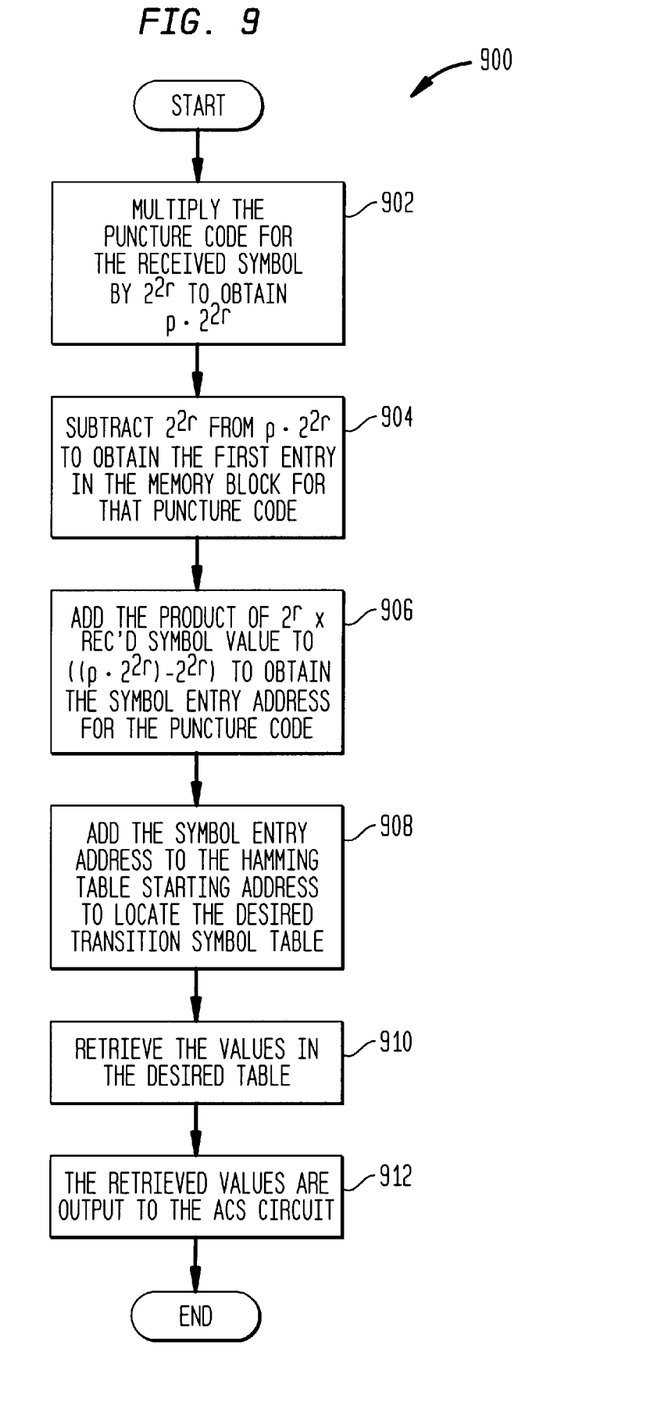
FIG. 9 is a flowchart illustrating a preferred method of obtaining a desired address from the Hamming distance table.

FIG. 9 is a flowchart 900 illustrating a preferred method of obtaining a desired address from the Hamming distance table 506. First, the puncture code for the received symbol is multiplied by $2^{2r}$ to provide $p \times 2^{2r}$ (step 902). Next, $2^{2r}$ is subtracted from this value to obtain a first entry in the memory block for that puncture code (step 904). (Recall that there are $2^r-1$ puncture code values.) Alternatively, 1 is subtracted from the puncture code value, which is then multiplied by $2^{2r}$.

Next, the received symbol is multiplied by $2^r$. This product is added to the value $((p \times 2^{2r})-2^{2r})$ to obtain the received symbol entry address for the puncture code (step 906).

This address is added to the Hamming distance table 506 starting address to locate the address of the desired table of the Hamming distances for the sequence of transition symbols 806 (step 908). The desired table of the Hamming distances for the sequence of transition symbols is retrieved (step 910) and output to the ACS circuit 510 for processing (step 912) as described below.

The Hamming distance retrieval circuit 508 performs this method once only per received symbol at the start of the first group of states, irrespective of the number of trellis states to decode. As a result, this operation of the Hamming distance retrieval circuit 508 does not contribute significantly to processing overhead. Thus, the address calculations are performed only once for each received symbol. Thereafter, Hamming distances may be retrieved for all states by reading successive address locations on the table. This is particularly useful for codes having a high number of states. For example, CDMA (code divisional multiplex access) uses m=8 and therefore has 256 states. After this method is performed once at the start of each new group of states defined in the ACS circuit 510, the Hamming distance retrieval circuit 508 increments the branch metric address pointer by 2 to access the next element in the table. Note that because the table is arranged in pairs—a path and a complement of the path—the address pointer is incremented by 2 to access the next address.)

Add/Compare/Select Circuit

The ACS circuit 510 expands all $2^m$ trellis states and determines the surviving path and metric. The ACS circuit 510 sequences the determination of the states according to the information provided from the state sequencer 502. For each Viterbi butterfly cell, the address counters for the current path memory 514 and previous path memory 512 are loaded. The ACS circuit 510 determines the surviving paths for the two states $S_{2j,t+1}$ and $S_{2j+1,t+1}$ based on the previous paths from states $S_{j,t}$ and $S_{2j+2}^{m-1}{}_{,t}$ in the following manner.

Figure 10A:
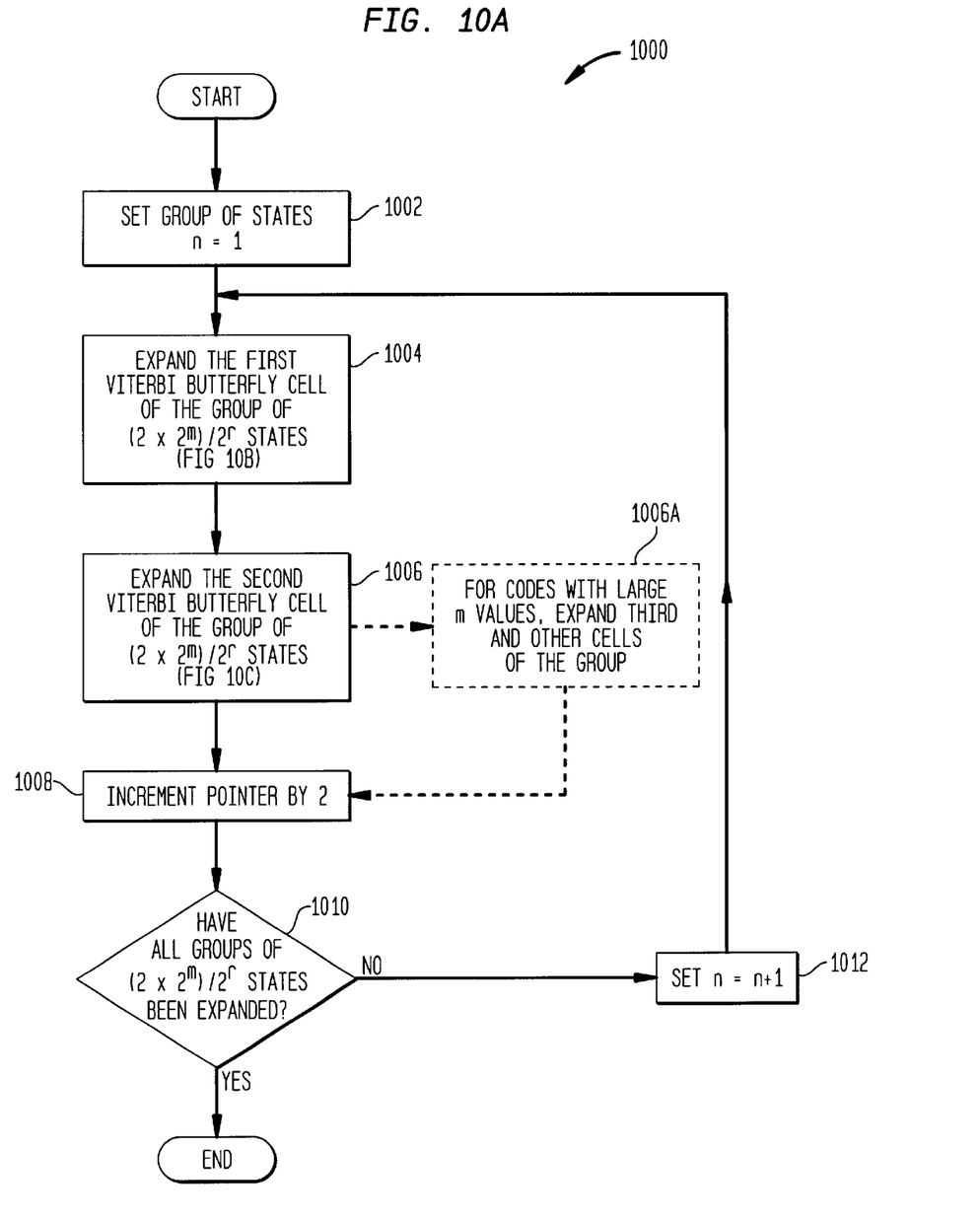
FIGS. 10A, 10B, and 10C are flowcharts illustrating a preferred method of determining the branch metric and surviving paths according to the present invention.
Figure 10B:
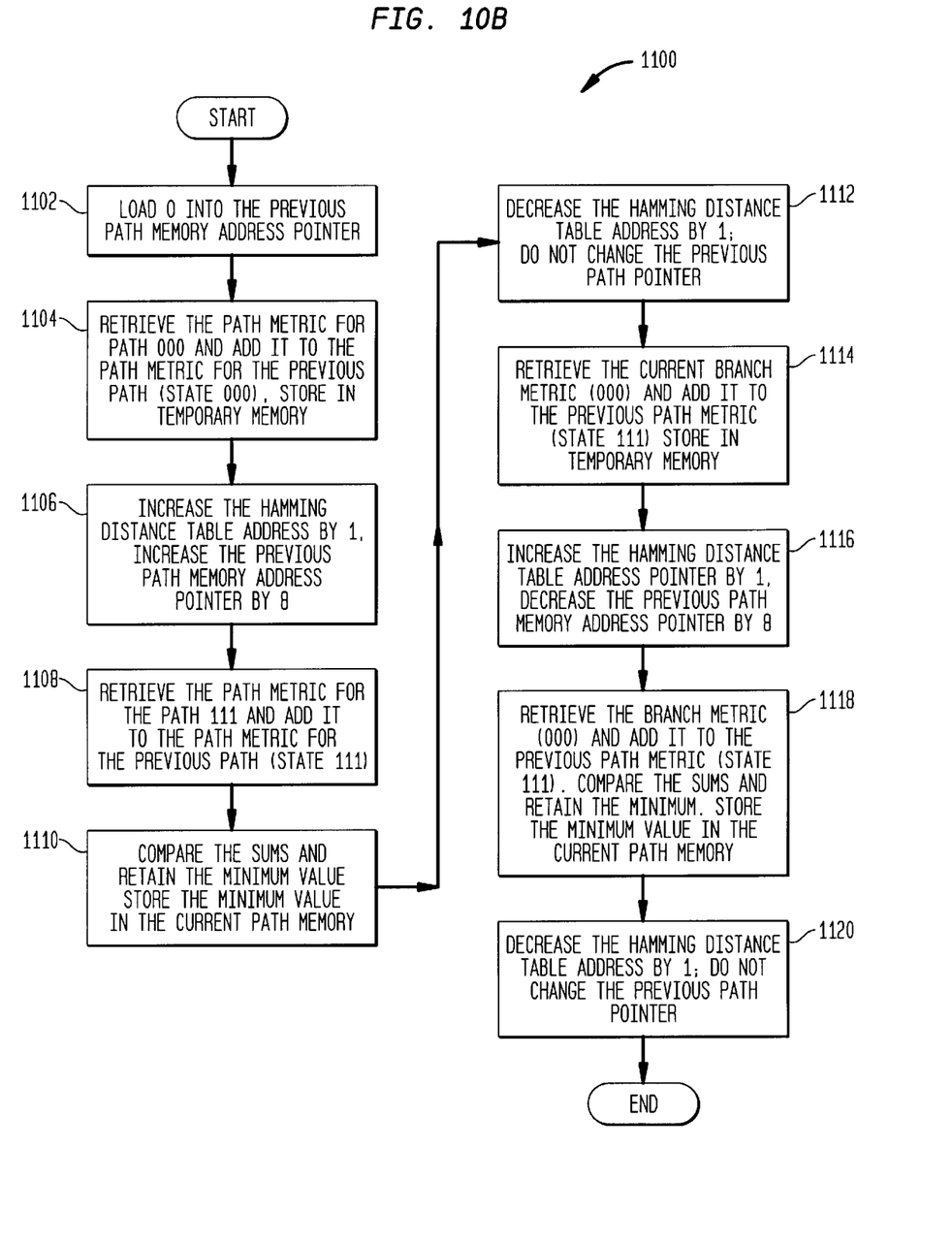
Figure 10C:
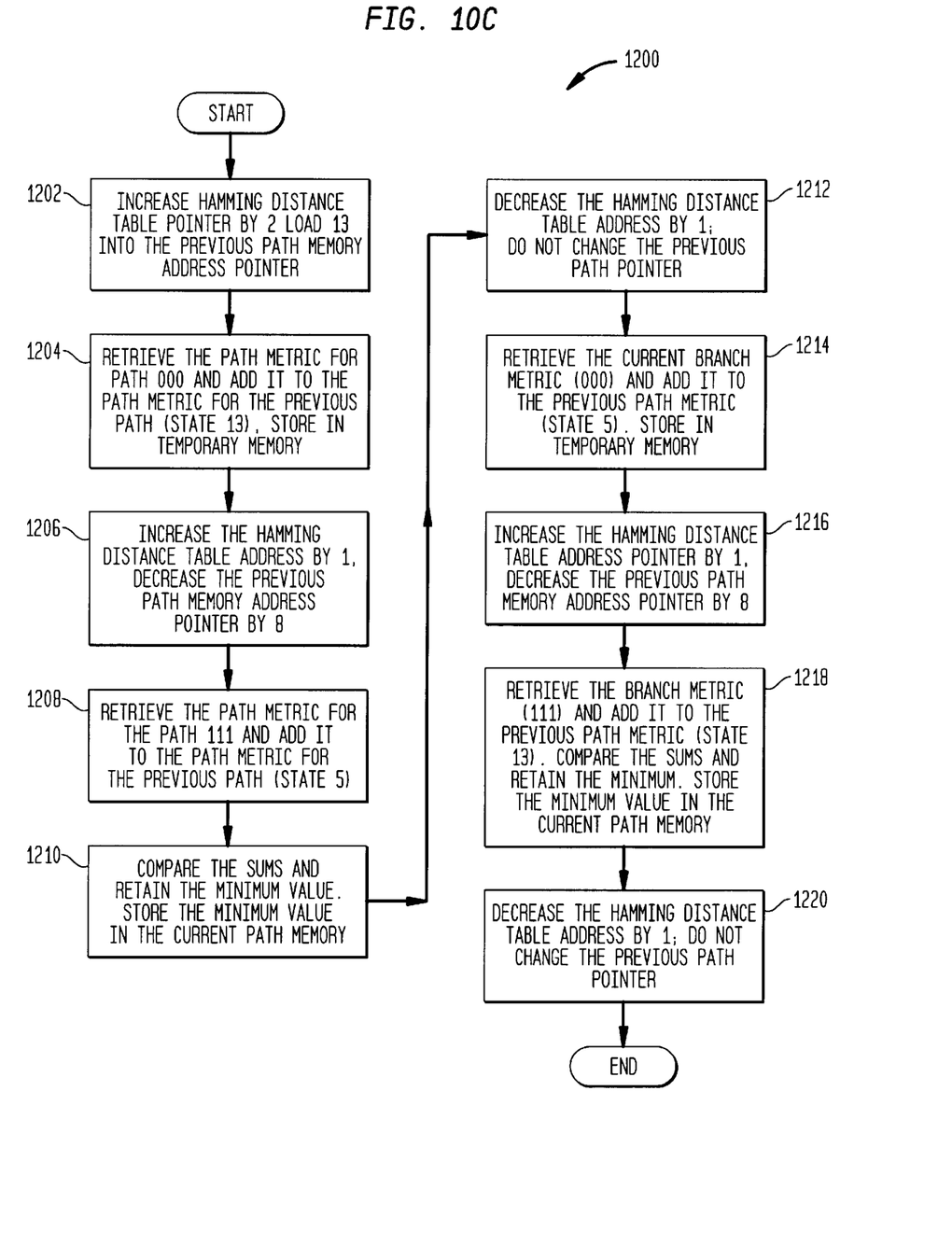

FIG. 10A is a flowchart 1000 illustrating a preferred method of determining the branch metric and surviving paths according to the present invention. First, a first group of $(2 \times 2^m)/2^r$ states is selected (step 1002). For this group, a first Viterbi butterfly cell is expanded (step 1004). A preferred manner of performing this expansion is illustrated in FIG. 10B, described below. For this same group, a second Viterbi butterfly cell is expanded (step 1006). A preferred manner for performing this expansion is illustrated in FIG. 10C, described below. These two cells use the same Hamming distance branch metric (and complement) identified by $d_{000}$, $d_{111}$ being the first two elements in the Hamming distance table. Note that for codes with larger values of m (such as CDMA), many states may belong to the same group having the same branch metric. In that case, there will be additional Viterbi cell expansion steps after the second cell (step 1006A). Next, the address to the Hamming distance table is incremented by 2 to retrieve metrics for the next group of states (step 1008). If not all of the groups of $(2 \times 2^m)/2^r$ states have been expanded (step 1010), the next group is selected (step 1012) and the process is repeated. When all of the groups have been expanded (step 1010), the process is complete.

FIG. 10B is a flowchart 1100 illustrating a preferred method for expanding a first Viterbi butterfly cell (using the values of the illustrative embodiment of FIG. 8B). In this example, the Viterbi butterfly cell expansion begins on the first line of FIG. 8B.

Load the value 0 into the previous path memory 512 address pointer (step 1102).

Calculate for state 0. Retrieve the first branch metric (for path 000), add it to the previous path metric (state 0), and store the sum in temporary memory (step 1104). The previous path metric is retrieved from memory 512 using the address counter (pointer) described above. After this operation the Hamming distance table address is incremented by 1, to point to the next branch metric (for path 111) and the previous path memory 512 pointer is incremented by 8 to point to the previous path metric for state 8 (step 1106). These two values are retrieved and added together (step 1108). This sum is compared to the path metric stored in temporary memory, with the minimum value of the two sums being retained and stored in the current path memory 514 for state 0 (step 1110). This is shown in the first two lines of FIG. 8B in the EVEN state column. After this operation the Hamming distance table address is decremented by 1 to point back to the branch metric for state 000 and the previous path memory pointer is not changed so as to remain pointed to the previous path metric for state 8 (step 1112).

Calculate for state 1. Retrieve the current branch metric for path 000 and add it to the previous path metric for state 8 (step 1114); the sum is stored in the temporary memory (shown by line one of FIG. 8B in the ODD states column). After this operation the Hamming distance table address is incremented by 1 to point to the next branch metric (for path 111) and the previous path memory 512 pointer is decremented by 8 so as to point to the previous path metric for state 0 (step 1116). The two values are retrieved and added together. This sum is compared with the sum in temporary memory. The minimum of these two sums is selected and stored in the current path memory 514 (step 1118). After this operation, the Hamming distance table address is decremented by 1 to point back to the branch metric for path 000 and the previous path memory pointer is not changed so as to remain pointed to the previous path metric for state 0 (step 1120). So at the end of the cell expansion the Hamming distance table address pointer and previous path memory pointer are back where they started.

In the preferred embodiment, the increment/decrement of addresses occurs simultaneously after each memory access for no additional CPU cycles. Thus, the whole process is performed without branch metric computation.

The calculation for states 10, 10+1 is called the second Viterbi butterfly cell. FIG. 10C is a flowchart 1200 illustrating a preferred method for expanding a second Viterbi butterfly cell. This is similar to the first cell expansion with one difference being that the previous path memory 512 pointer starts as a high value and is decremented. Again, the illustrative example of FIG. 8B is used.

Calculate for state 10. Increment the Hamming distance table address by 2 (to point to line 3 of the table of FIG. 8B). Load the value 13 into the previous path memory 512 address pointer (step 1202). Hamming distance address is now pointed at the branch metric for path 000, as seen on line 3 of FIG. 8B. Retrieve the Hamming distance branch metric and the previous path metric, add them and store the sum in temporary memory (step 1204). After this operation, the Hamming distance table address is incremented by 1 to retrieve the next branch metric (for path 111) and the previous path memory pointer is decremented by 8 so as to point to the previous path metric for state 5 (step 1206). These metrics are retrieved and added (step 1208). This sum is compared with the sum stored in temporary storage and the minimum result is selected and stored in current path memory for state 13 (step 1210). After this operation the Hamming distance table address is decremented by 1 to retrieve the next branch metric (for path 000) and the previous path memory pointer remains unchanged so as to point to the previous path metric for state 5 (step 1212).

Calculate for state 11. Retrieve the Hamming distance branch metric at path 000 and add it to the previous path metric for state 5 and store the result (step 1214). The Hamming distance table address is incremented by 1 (to path 111) and the previous path memory pointer is incremented by 8 (to state 13) (step 1216). Retrieve the Hamming distance branch metric at path 111 and add it to the previous path metic for state 13. Compare this sum with the first sum stored in temporary memory. Store the minimum of the two sums in the current path memory 514 as the surviving path for state 11 (step 1218). After this operation, the Hamming distance table address is decremented by 1 (to path 000) and the previous path memory pointer is not changed so as to remain pointed to state 13 (step 1220).

Attached as Appendix B is assembly code for a preferred method of implementing the inventive decoder.

Conclusion

This inventive device performs the following functions:

The state sequencer 502 determines the optimum state sequencing.

The Hamming distance table generator 504 predetermines the Hamming metric table, such as on initialization of the decoder.

The Hamming distance retrieval circuit 508 determines the metric address sequence for each received symbol.

The ACS circuit 510 determines the surviving path metrics for each received symbol.

The inventive apparatus and method provide a method to generate branch metrics for punctured convolutional codes without computing them in real-time metric. This results in a significant reduction in computational requirements for Viterbi decoders, especially for those with large constraint lengths.

The above described embodiments of the invention are intended to be illustrative only. For example, the invention has been described using a Hamming distance as a cost function. A person skilled in the art readily recognizes that other functions may be suitable and substituted in place of a Hamming distance. Numerous alternative embodiments may be devised by those skilled in the art without departing from the spirit and scope of the following claims.

I claim:

1. A channel decoder in a digital wireless communications device for decoding a signal encoded using a convolutional encoder having m delay elements, the channel decoder receiving symbols and comprising:
   a. a state sequencer configured to group $2^m$ possible states into groups of similar branch metrics;
   b. a Hamming distance table generator responsive to the state sequencer and configured to determine a Hamming distance for possible combinations of puncture codes, received symbols, and transition symbols;
   c. a Hamming distance table configured to store results of the Hamming distance table generator;
   d. a Hamming distance retrieval circuit responsive to receive a puncture code and received symbols to retrieve appropriate entries stored in the Hamming distance table; and
   e. an add/compare/select (ACS) circuit responsive to an output of the Hamming distance table and the state sequencer to output the surviving path metrics for trellis states corresponding to each received symbol.

2. The channel decoder of claim 1, wherein the state sequencer is further configured to group the $2^m$ states into groups of $(2 \times 2^m)/2^r$, where r is a bandwidth expansion of the unpunctured convolutional encoder.

3. The channel decoder of claim 1, wherein the Hamming distance table generator is further configured to:
   a. order transition symbols according to a determined sequence received from the state sequencer;
   b. order puncture codes and received symbols in increasing order;
   c. process a received symbol with respect to a transition symbol;
   d. apply a puncture code to the processed received symbol; and
   e. determine a Hamming distance for the processed received symbol.

4. The channel decoder of claim 3, wherein the Hamming distance table generator is further configured to determine the Hamming distance for a plurality of puncture codes, received symbols, and transition symbols.

5. The channel decoder of claim 3, wherein the Hamming distance table generator is further configured to determine Hamming distances at an initialization of the communications device.

6. The channel decoder of claim 1, wherein the Hamming distance table is arranged as a three dimensional look-up table which stores the Hamming distance metrics for each point of a three dimensional space, wherein:
   a. a first dimension is a range of puncture codes;
   b. a second dimension is a range of received symbols; and
   c. a third dimension is a range of transition symbols for a particular puncture codes and received symbol.

7. The channel decoder of claim 6, wherein the Hamming distance table is stored in a permanent memory.

8. The channel decoder of claim 6, wherein the Hamming distance table is stored in a volatile memory and the Hamming distance table generator is configured to determine the Hamming distance at an initialization of the communications device.

9. The channel decoder of claim 1, wherein the Hamming distance retrieval circuit is further configured to combine the received puncture code and received symbol to obtain an address in the Hamming distance table containing desired information.

10. The channel decoder of claim 1, further comprising a previous path memory connected to the ACS circuit; and a current path memory connected to the ACS circuit.

11. The channel decoder of claim 1, wherein the ACS circuit is further configured to retrieve a branch metric and determine a surviving path for all states of a particular received symbol by:
   a. selecting a group of states;
   b. expanding a first Viterbi butterfly cell for the selected group; and
   c. expanding a second Viterbi butterfly cell for the selected group.

12. The channel decoder of claim 11, wherein the ACS circuit is further configured to expand the first Viterbi butterfly cell by:
   a. combining a first branch metric for a first path with a first previous path metric to determine a first sum for a first state;
   b. combining a second branch metric for a second path with a second previous path metric to determine a second sum for the first state;
   c. storing a minimum value for the first state selected from the first sum and second sum;
   d. combining the first branch metric for the first path with the second previous path metric to determine a third sum for a second state;
   e. combining the second branch metric for the second path with the first previous path metric to determine a fourth sum for the second state; and
   f. storing a minimum value for the second state selected from the third sum and fourth sum.

13. The channel decoder of claim 12, wherein the ACS circuit is further configured to expand the second Viterbi butterfly cell by:
    a. combining the first branch metric for the first path with a third previous path metric to determine a fifth sum for a third state;
    b. combining the second branch metric for the second path with a fourth previous path metric to determine a sixth sum for the third state;
    c. storing a minimum value for the third state selected from the fifth sum and sixth sum;
    d. combining the first branch metric for the first path with the fourth previous path metric to determine a seventh sum for a fourth state;
    e. combining the second branch metric for the second path with the third previous path metric to determine an eighth sum for the fourth state; and
    f storing a minimum value for the fourth state selected from the seventh sum and eighth sum.

14. A method of decoding a signal encoded using a convolutional encoder having m delay elements, the channel decoder receiving symbols, the method comprising the steps of:
    a. grouping in a state sequencer $2^m$ possible states into groups of similar branch metrics;
    b. determining a distance for possible combinations of puncture codes, received symbols, and transition symbols;
    c. storing in a distance table results of the distance determination;
    d. receiving at a distance retrieval circuit a puncture code and received bits and retrieving appropriate entries stored in a distance table; and
    e. in response to an output of the distance table and the state sequencer, an add/compare/select circuit determining surviving path metrics for all trellis states corresponding to the received symbols.

15. The method of claim 14, wherein the step of determining a distance further comprises the steps of:
    a. ordering transition symbols according to a determined sequence received from the state sequencer;
    b. ordering puncture codes and received symbols in increasing order;
    c. processing a received symbol with respect to a transition symbol;
    d. applying a puncture code to the processed received symbol; and
    e. determining a distance for the processed received symbol.

16. The method of claim 15, wherein the step of determining a distance further comprises the step of determining the distance for a plurality of puncture codes, received symbols, and transition symbols.

17. The method of claim 15, wherein the step of determining a distance is performed at an initialization of a communications device.

18. The method of claim 14, wherein the step of retrieving appropriate entries stored in a distance table further comprises combining the received puncture code and received symbol and obtaining an address in the distance table containing the appropriate entries.

19. The method of claim 14, wherein the step of determining the surviving path metrics for all states corresponding to the received symbols further comprises the steps of expanding a plurality of Viterbi butterfly cells.

20. The method of claim 19, wherein the step of expanding a first Viterbi butterfly cell further comprises the steps of:
    a. combining a first branch metric for a first path with a first previous path metric to determine a first sum for a first state;
    b. combining a second branch metric for a second path with a second previous path metric to determine a second sum for the first state;
    c. storing a minimum value for the first state selected from the first sum and second sum;
    d. combining the first branch metric for the first path with the second previous path metric to determine a third sum for a second state;
    e. combining the second branch metric for the second path with the first previous path metric to determine a fourth sum for the second state; and
    f. storing minimum value for the second state selected from the third sum and fourth sum.

21. The method of claim 20, wherein after the step of determining the first sum, increasing an address of the distance table to point to the second branch metric for the second path and increasing a previous path memory address pointer to point to a second previous path memory.

22. The method of claim 20, wherein after the step of determining the second sum, decreasing an address of the distance table to point to the first branch metric for the first path and leaving a previous path memory address pointer unchanged.

23. The method of claim 20, wherein after the step of determining the third sum, increasing an address of the distance table to point to the second branch metric for the second path and decreasing a previous path memory address pointer to point to a first previous path memory.

24. The method of claim 20, wherein the step of expanding a second Viterbi butterfly cell further comprises the steps of:
    a. combining the first branch metric for the first path with a third previous path metric to determine a fifth sum for a third state;
    b. combining the second branch metric for the second path with a fourth previous path metric to determine a sixth sum for the third state;
    c. storing a minimum value for the third state selected from the fifth sum and sixth sum;
    d. combining the first branch metric for the first path with the fourth previous path metric to determine a seventh sum for a fourth state;
    e. combining the second branch metric for the second path with the third previous path metric to determine an eighth sum for a fourth state; and
    f. storing a minimum value for the fourth state selected from the seventh sum and the eighth sum.

25. The method of claim 24, wherein after the step of determining the fifth sum, increasing an address of the distance table to point to the second branch metric for the second path and decreasing a previous path memory address pointer to point to a fourth previous path memory.

26. The method of claim 24, wherein after the step of determining the sixth sum, decreasing an address of the distance table to point to the first branch metric for the first path and leaving a previous path memory address pointer unchanged.

27. The method of claim 24, wherein after the step of determining the seventh sum, increasing an address of the distance table to point to the second branch metric for the second path and increasing a previous path memory address pointer to point to a third previous path memory.

28. The method of claim 14, wherein the distance table is a Hamming distance table and wherein the step of determining a distance further comprises determining a Hamming distance.

29. A cost table for a channel decoder comprising a store of cost metrics for points of a three dimensional space, wherein:
   a. a first dimension is a range of puncture codes;
   b. a second dimesion is a range of received symbols; and
   c. a third dimension is a range of transition symbols for a particular puncture codes and received symbol.

* * * * *